US012237177B2

United States Patent
Fukui et al.

(10) Patent No.: US 12,237,177 B2
(45) Date of Patent: Feb. 25, 2025

(54) SUBSTRATE PROCESSING APPARATUS AND SUBSTRATE PROCESSING METHOD

(71) Applicant: Tokyo Electron Limited, Tokyo (JP)

(72) Inventors: Shogo Fukui, Koshi (JP); Masataka Gosho, Koshi (JP); Satoshi Okamura, Koshi (JP); Tomohito Ura, Koshi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 362 days.

(21) Appl. No.: 17/649,933

(22) Filed: Feb. 4, 2022

(65) Prior Publication Data

US 2022/0254658 A1 Aug. 11, 2022

(30) Foreign Application Priority Data

Feb. 8, 2021 (JP) ................ 2021-018400

(51) Int. Cl.
*H01L 21/67* (2006.01)
*H01L 21/683* (2006.01)

(52) U.S. Cl.
CPC ...... *H01L 21/67034* (2013.01); *H01L 21/683* (2013.01)

(58) Field of Classification Search
CPC ......... H01L 21/02101; H01L 21/02041; H01L 21/02052; H01L 21/02054; H01L 21/02057; H01L 21/67017; H01L 21/67023; H01L 21/67028; H01L 21/67034; H01L 21/6704; H01L 21/67046; H01L 21/67051; H01L 21/67057;

(Continued)

(56) References Cited

U.S. PATENT DOCUMENTS

| 2021/0391196 A1* | 12/2021 | Kim ................. H01L 21/68 |
| 2022/0206031 A1* | 6/2022 | Choi ............ H01L 21/67253 |
| 2022/0395986 A1* | 12/2022 | Blank .............. B25J 9/042 |

FOREIGN PATENT DOCUMENTS

| JP | 2005-286211 A | 10/2005 |
| JP | 2013-251550 A | 12/2013 |
| WO | WO-2018216476 A1 * | 11/2018 ....... H01L 21/02057 |

OTHER PUBLICATIONS

Machine Translation of Kiyose, WO-2018216476-A1, Nov. 2018. (Year: 2018).*

* cited by examiner

*Primary Examiner* — David G Cormier
(74) *Attorney, Agent, or Firm* — Chrisman Gallo Tochtrop LLC

(57) ABSTRACT

A substrate processing apparatus configured to dry a substrate having a liquid film formed on a pattern formation surface thereof with a supercritical fluid includes a processing vessel which is configured to accommodate the substrate therein and into which the supercritical fluid is supplied; a substrate holder which has a base member configured to support the substrate from below while allowing the pattern formation surface of the substrate to face upwards, and which is configured to hold the substrate within the processing vessel; a first detector configured to detect an inclination of the base member with respect to a horizontal plane; a posture adjusting device configured to adjust the inclination of the base member with respect to the horizontal plane; and a controller configured to control the posture adjusting device to perform horizontal leveling of the base member based on a detection result of the first detector.

9 Claims, 8 Drawing Sheets

(58) Field of Classification Search
CPC ......... H01L 21/67253; H01L 21/67259; H01L 21/67265; H01L 21/67288; H01L 21/67739; H01L 21/67748; H01L 21/68; H01L 21/683; H01L 21/68742; H01L 21/6875

See application file for complete search history.

SUBSTRATE PROCESSING APPARATUS AND SUBSTRATE PROCESSING METHOD

CROSS-REFERENCE TO RELATED APPLICATION

This application claims the benefit of Japanese Patent Application No. 2021-018400 filed on Feb. 8, 2021, the entire disclosure of which is incorporated herein by reference.

TECHNICAL FIELD

The various aspects and embodiments described herein pertain generally to a substrate processing apparatus and a substrate processing method.

BACKGROUND

Recently performed in the manufacture of a semiconductor device is a supercritical drying processing in which a substrate whose top surface is wet with a processing liquid is brought into contact with a processing fluid in a supercritical state to replace the processing liquid with the processing fluid in the supercritical state to thereby dry the substrate. Patent Document 1 describes a supercritical drying method and an apparatus for performing this supercritical drying method. In the disclosure of Patent Document 1, the supercritical fluid is first supplied below the substrate within a chamber at a small flow rate to suppress damage on the substrate due to initial pressurization. After an internal pressure of the chamber reaches a preset pressure, the supercritical fluid is then supplied toward the top surface of the substrate at a large flow rate.

Patent Document 1: Japanese Patent Laid-open Publication No. 2013-251550

SUMMARY

In one exemplary embodiment, there is provided a substrate processing apparatus configured to dry a substrate having a liquid film formed on a pattern formation surface thereof with a supercritical fluid. The substrate processing apparatus includes a processing vessel which is configured to accommodate the substrate therein and into which the supercritical fluid is supplied; a substrate holder which has a base member configured to support the substrate from below while allowing the pattern formation surface of the substrate to face upwards, and which is configured to hold the substrate within the processing vessel; and a first detector configured to detect an inclination of the base member with respect to a horizontal plane.

The foregoing summary is illustrative only and is not intended to be any way limiting. In addition to the illustrative aspects, embodiments, and features described above, further aspects, embodiments, and features will become apparent by reference to the drawings and the following detailed description.

BRIEF DESCRIPTION OF THE DRAWINGS

In the detailed description that follows, embodiments are described as illustrations only since various changes and modifications will become apparent to those skilled in the art from the following detailed description. The use of the same reference numbers in different figures indicates similar or identical items.

DETAILED DESCRIPTION

Figure 1:
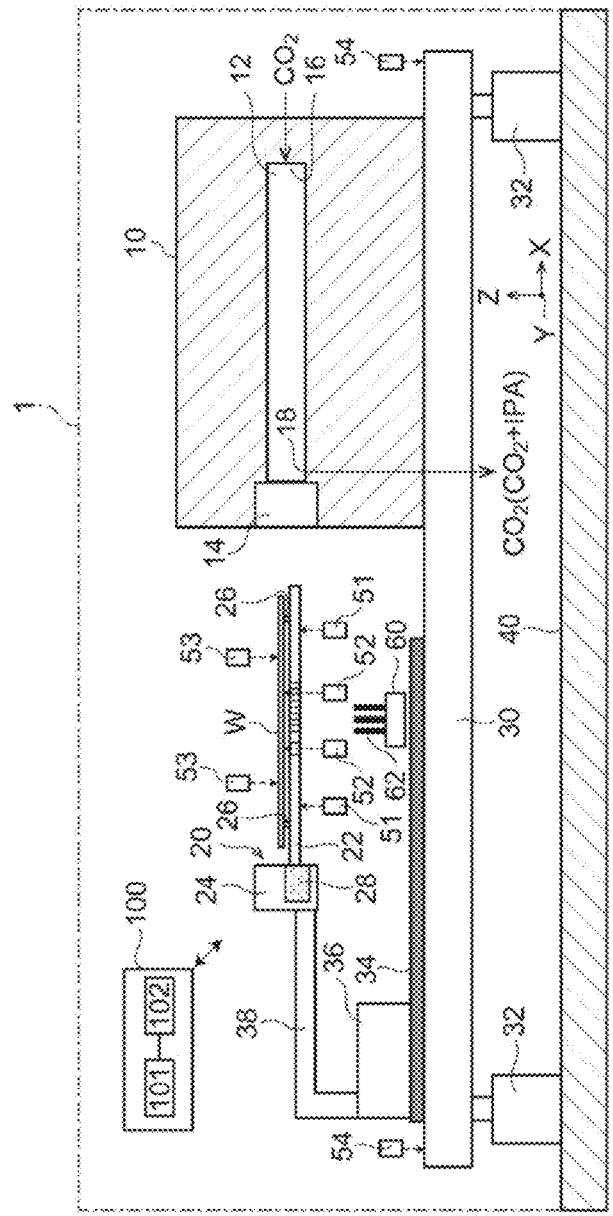
FIG. 1 is longitudinal side view of a substrate processing apparatus according to an exemplary embodiment.

In the following detailed description, reference is made to the accompanying drawings, which form a part of the description. In the drawings, similar symbols typically identify similar components, unless context dictates otherwise. Furthermore, unless otherwise noted, the description of each successive drawing may reference features from one or more of the previous drawings to provide clearer context and a more substantive explanation of the current exemplary embodiment. Still, the exemplary embodiments described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein and illustrated in the drawings, may be arranged, substituted, combined, separated, and designed in a wide variety of different configurations, all of which are explicitly contemplated herein.

A supercritical drying apparatus 1 as an exemplary embodiment of a substrate processing apparatus will be described with reference to the accompanying drawings. For the convenience of explanation, directions are indicated by using the XYZ orthogonal coordinates system shown in each drawing. The X direction and the Y direction are horizontal directions orthogonal to each other, and the Z direction is a vertical direction.

As shown in FIG. 1, the supercritical drying apparatus 1 has a processing vessel 10 serving as a supercritical chamber. A processing space 12 is formed inside the processing vessel 10. The processing vessel 10 has, on a side surface thereof, an opening 14 serving as an entrance to the processing space 12.

The processing vessel 10 has a fluid supply 16 and a fluid drain unit 18. A processing fluid (for example, carbon dioxide in a supercritical state) is supplied to the fluid supply 16 from a non-illustrated source for the processing fluid in the supercritical state (as indicated by an arrow), and discharged into the processing space 12 from the fluid supply 16. The fluid supply 16 is configured by, for example, a bar nozzle. The processing fluid is drained to the outside of the processing space 12 via the fluid drain unit 18 (as indicated by an arrow). Although detailed description of a supply system and a drain system for the processing fluid is omitted here, any of various commonly known configurations in a supercritical drying apparatus may be adopted.

The supercritical drying apparatus 1 includes a substrate holder 20. In the shown exemplary embodiment, the substrate holder 20 is formed as a tray configured to be movable in a horizontal direction (X direction), and is equipped with a substantially plate-shaped base member 22 and a lid 24 connected to one end of the base member 22.

At least three (four in the shown example) supporting pins 26 are provided on a top surface of the base member (base member main body) 22, protruding upwards. The supporting pins 26 are configured to be vertically moved by, for example, a linear actuator 260 (see FIG. 2) embedded in the base member (base member main body) 22. The supporting pins 26 may be mainly used for fine adjustment of a height position of a substrate W such as a semiconductor wafer supported by the supporting pins 26 and fine adjustment of a posture (an inclination with respect to a horizontal plane) of this substrate W. Here, a portion (plate-shaped portion) of the base member 22 except the supporting pins 26 is also called the base member main body.

Figure 2:
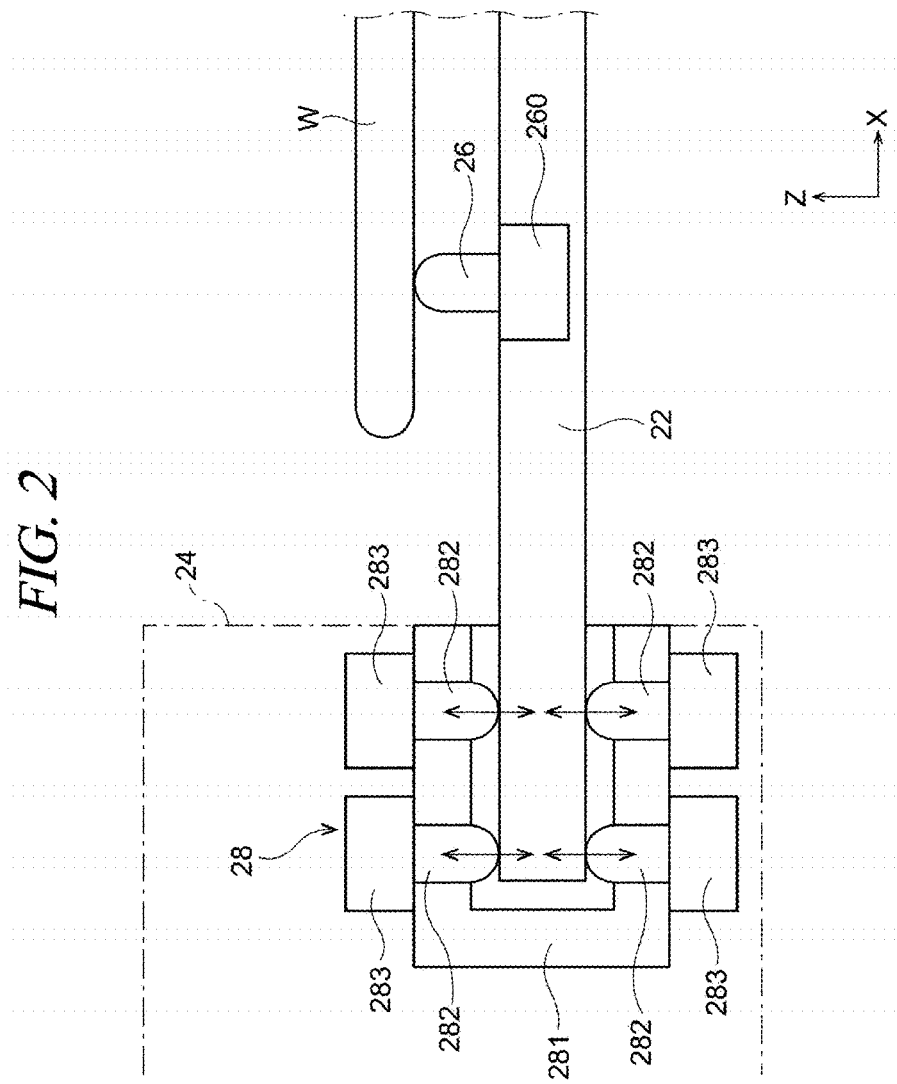
FIG. 2 is a schematic longitudinal side view illustrating a configuration example of a posture adjusting device.
Figure 4:
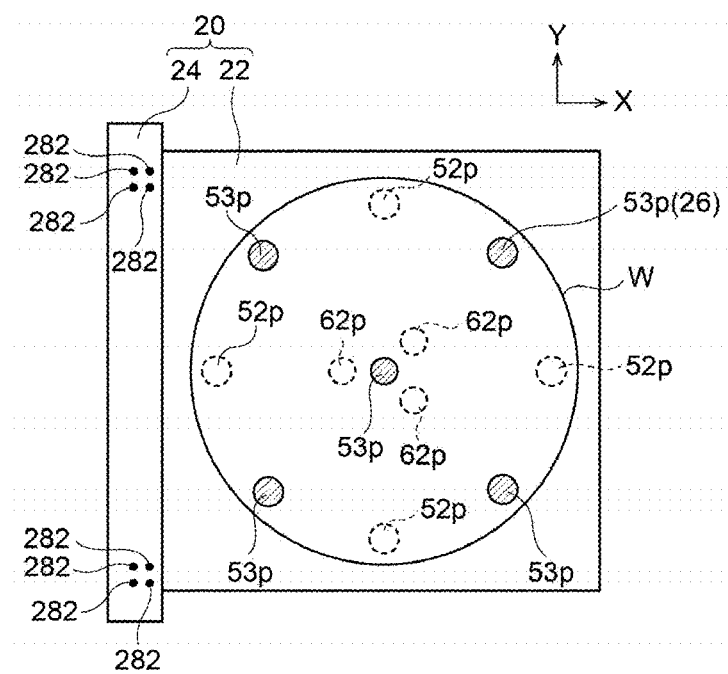
FIG. 4 is a plan view for describing the radiation positions of the detection light or the like, seen from above the substrate holder.

A posture adjusting device 28 configured to adjust an inclination of the base member 22 with respect to the horizontal plane is provided between the base member 22 and the lid 24. As shown in FIG. 2, the posture adjusting device 28 includes, for example, a base 281 having a U-shaped (square bracket-shaped) cross section and a total of eight movable push pins 282 fixed to the base 281. The movable push pins 282 are configured to be vertically movable by linear actuators 283. Each linear actuator 283 may be provided with, for example, a ball screw. The eight movable push pins 282 are divided into two sets. As schematically shown in FIG. 4, the first set of four movable push pins 282 are provided on one side of the lid 24, and the second set of four movable push pins 282 are provided on the other side of the lid 24. In this configuration, by adjusting a height position (Z direction position) of a leading end of each movable push pin 282, the inclination (specifically, both an inclination direction and an inclination amount) of the base member 22 with respect to the horizontal plane can be adjusted. The configuration of the posture adjusting device 28 is not limited to that shown in FIG. 2, and any of various configurations may be adopted as long as the inclination of the base member 22 with respect to the horizontal plane is adjustable.

The substrate holder 20 is configured to be horizontally moved forward and backward between a "processing position (position shown in FIG. 6 and FIG. 8 to be described later)" and a "retreat position (position shown in FIG. 1)". When the substrate holder 20 is located at the processing position, the lid 24 is inserted into the opening 14 of the processing vessel 10 to seal the opening 14, and the base member 22 is accommodated in the processing space 12. When the substrate holder 20 is located at the retreat position, on the other hand, the lid 24 opens the opening 14, and the base member 22 is retreated to the outside of the processing space 12.

The processing vessel 10 is fixed to a supporting table 30. The supporting table 30 may have a substantially rectangular shape when viewed on a plane having the X direction as a long side and the Y direction as a short side. The supporting table 30 is mounted to a machine frame 40 (frame) of the substrate processing apparatus with three or more (for example, four) lifting actuators 32 therebetween. The machine frame 40 may be regarded as a stationary structure to which various components of the supercritical drying apparatus are fixed. The lifting actuators 32 may be provided at four corners of the rectangular supporting table 30. Each lifting actuator 32 may be, for example, a linear actuator having an electric rotary motor, a ball screw, and the like.

A guide rail 34 extending in the horizontal direction (X direction) is provided on the supporting table 30. A slider 36 configured to be moved along the guide rail 34 by a driving force generated by a non-illustrated driving mechanism (which is embedded in, for example, the slider 36) is provided on the guide rail 34. The substrate holder 20 is fixed to the slider 36 with arms 38 therebetween. Accordingly, by moving the slider 36 along the guide rail 34, the substrate holder 20 can be moved between the processing position and the retreat position mentioned above.

Provided below the substrate holder 20 placed at the retreat position is a substrate lifter 60 configured to be movable in a vertical direction by a substrate lifter moving mechanism (not shown). The substrate lifter 60 has more than two (three in the shown example) lift pins 62. By raising the substrate lifter 60 to be placed at a raised position, the substrate W supported by the substrate holder 20 (specifically, the supporting pins 26) can be lifted up by the lift pins 62 while being supported by leading ends thereof. To enable this, the base member 22 is provided with through holes through which the lift pins 62 can pass. Positions of these through holes are indicated by a reference numeral 62P in FIG. 3 and FIG. 4.

When the substrate lifter 60 is placed at the raised position, the substrate W can be transferred between the substrate lifter 60 and a non-illustrated substrate transfer arm which has been advanced into the supercritical drying apparatus 1 from the rear toward the front in the Y direction of FIG. 1. That is, the substrate W before being processed can be carried in by performing the following processes S1 to S3. With the substrate holder 20 located at the retreat position, the empty substrate lifter 60 is placed at the raised position (S1). The non-illustrated substrate transfer arm places the substrate W on the lift pins 62 of the substrate lifter 60 (S2). After the substrate transfer arm is retreated from above the base member 22, the substrate lifter 60 is lowered, handing the substrate W over to the supporting pins 26 of the base member 22. To carry out the substrate W after being processed, these processes need to be performed in the reverse order.

The substrate lifter 60 may be configured to be movable only in an up-and-down direction. In this case, interference between the substrate lifter 60 and components around it can be avoided. Instead, the substrate lifter 60 may be configured to be movable not only in the up-and-down direction but also in the Y direction (a depth direction in the paper plane of FIG. 1). With this configuration, the interference between the substrate lifter 60 and the components around it can be avoided easily.

The supercritical drying apparatus 1 has a multiple number of distance sensors. The distance sensors may be, by way of non-limiting example, optical distance sensors using infrared rays or laser. The distance sensors are fixed to the machine frame 40 itself or to a non-illustrated sensor holder fixed to the machine frame 40. The distance sensors include a plurality of (four in the shown example) first distance sensors 51, a plurality of (five in the shown example) second distance sensors 52, a plurality of (five in the shown example) third distance sensors 53, and a plurality of (four in the shown example) fourth distance sensors 54.

The first distance sensors 51 are located under the base member 22 of the substrate holder 20 which is located at the retreat position (the position shown in FIG. 1). Each of the first distance sensors 51 is configured to measure a vertical distance (a distance measured along the Z direction) to a bottom surface of the base member 22 of the substrate holder 20.

The second distance sensors 52 are located under the base member 22 of the substrate holder 20 which is located at the retreat position, and each of the second distance sensors 52 is configured to measure a vertical distance to a bottom surface of the substrate W supported on the base member 22 of the substrate holder 20 (specifically, on the supporting pins 26). In order to allow sensor light of the second distance sensors 52 to reach the bottom surface of the substrate W, the base member 22 of the substrate holder 20 has the same number of through holes as the second distance sensors 52. Each through hole is located on an optical axis (optical path of the sensor light) of corresponding one of the second distance sensors 52 when the substrate holder 20 is located at the retreat position. The through holes may be provided at positions indicated by a reference numeral 52*p* in FIG. 3 and FIG. 4, for example.

As long as the sensor light of the second distance sensors 52 can reach the bottom surface of the substrate W, it is not necessary to provide the same number of the through holes as the second distance sensors 52. That is, the base member 22 may be provided with some kind of notches.

The third distance sensors 53 are located above the base member 22 of the substrate holder 20 which is located at the retreat position. Each of the third distance sensors 53 is configured to measure a vertical distance to a top surface of the substrate W (specifically, a liquid film formed on the top surface of the substrate W) supported on the base member 22 of the substrate holder 20.

The fourth distance sensors 54 are located above four corners of the supporting table 30 to measure vertical distances to the four corners of the supporting table 30. Based on measurement values of the fourth distance sensors 54, an inclination of the supporting table 30 (specifically, an inclination of the top surface of the supporting table 30) with respect to the horizontal plane may be detected.

Figure 3:
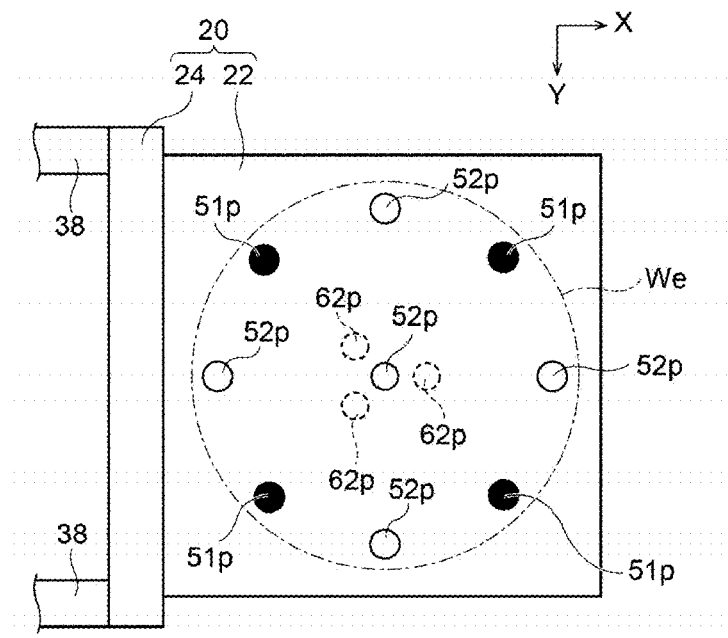
FIG. 3 is a plan view for describing radiation positions of detection light or the like, seen from below a substrate holder.

In FIG. 3, an example of radiation positions 51*p* of the sensor light of the first distance sensors 51 onto the bottom surface of the base member 22 are indicated by black circles. A large circle We indicated by a broken line indicates a position of a periphery (edge) of the substrate W. The radiation positions 51*p* of the sensor light of the first distance sensors 51 are located near the periphery of the substrate W when viewed from the top. The radiation positions 51*p* lie on a circumference of a circle centered on a center of the substrate W while being respectively arranged at angular positions calculated by dividing the circumference by N (N is the number of the first distance sensors, and in the shown example, N is 4).

Based on detection values of the first distance sensors 51, an inclination direction and an inclination amount (inclination angle) of the base member 22 with respect to the horizontal plane (a plane perpendicular to the direction of gravity) can be specified. If N is equal to or larger than 3, it is apparent that the inclination direction and the inclination amount of the base member 22 can be specified. Here, by setting N to 4 (N=4) so that the first distance sensors 51 are provided in a sufficient number or more, reliability of the measurement is improved.

In addition, when the supercritical drying apparatus 1 is installed, the first distance sensors 51 are calibrated (any of mechanical calibration, electrical calibration, and computational calibration may be used). For example, since the measurement target surface (here, the bottom surface of the base member 22) is horizontal, the detection values from the first distance sensors 51 are set to be all same. In this aspect, the same goes for the second to fourth distance sensors.

In FIG. 3, an example of the radiation positions 52*p* of the sensor light of the second distance sensors 52 onto the bottom surface of the substrate W are indicated by white circles. One radiation position 52*p* of the sensor light of the second distance sensor 52 is set at the center of the substrate W and four radiation positions 52*p* are set near the periphery of the substrate W. The four radiation positions 52*p* near the periphery of the substrate W are located on a circumference of a circle centered on the center of the substrate W while being respectively arranged at angular positions obtained by dividing the circumference by 4.

Based on detection values of the second distance sensors 52, an inclination direction and an inclination amount (inclination angle) of the substrate W with respect to the horizontal plane can be specified. Since an IPA liquid film exists on the front surface of the substrate W, it is difficult to accurately measure the inclination of the substrate W itself from the front surface side of the substrate W. However, by radiating the detection light to the rear surface of the substrate W, it becomes possible to accurately measure the inclination of the substrate W.

Further, since the radiation position 52*p* of the second distance sensor is set at the center of the substrate W as well, bending of the substrate W, if any, can also be detected. The number of the second distance sensors 52 is not limited to five but can be selected as required.

As illustrated in FIG. 3, it is desirable to respectively provide the two arms 38 to both sides of the lid 24 of the substrate holder 20. With this configuration, an apparatus design (component layout) in which it is ensured that the arms 38 do not interfere (collide) with the first distance sensors 51 and the second distance sensors 52 within their movement ranges is easily achieved.

In FIG. 4, an example of radiation positions 53*p* of the sensor light of the third distance sensors 53 onto the top surface of the substrate W (specifically, a surface of a liquid puddle on the top surface of the substrate W) are indicated by hatched circles. The same as in the case of the second distance sensors 52, one of the radiation positions 53*p* of the sensor light of the third distance sensors 53 is set at the center of the substrate W and four radiation positions 53*p* are set near the periphery of the substrate W. In the shown example, the radiation positions 53*p* of the sensor light of the third distance sensors 53 are set while being shifted from the radiation positions 52*p* of the sensor light of the second distance sensors 52 by 45 degrees around the center of the substrate W, but not limited thereto.

Based on detection values of the third distance sensors 53, a height of a liquid surface of the liquid film (puddle) on the top surface of the substrate W and uniformity thereof can be detected. If the height of the liquid surface is too high, the liquid may come into contact with a bottom surface of a ceiling wall confining the processing space 12 of the processing vessel 10. If the height of the liquid surface is too low, on the other hand, there is a risk that a drying failure may occur due to early drying. When the height of the liquid surface is non-uniform, there is a risk that the liquid may be in local contact with the bottom surface of the ceiling wall. Further, when the height of the liquid surface is non-uniform, there is also a likelihood that the thickness of the liquid film is non-uniform. In this case, there is a risk of local drying failure, mass generation of particles, or pattern collapse.

In addition, the four supporting pins 26 on the top surface of the base member 22 may be disposed directly under the radiation positions 53$p$ of the sensor light of the third distance sensors 53 (four near the periphery of the substrate W). Instead, the four supporting pins 26 may be arranged at angular positions obtained by dividing the circumference of the circle centered on the center of the substrate W by four.

As shown in FIG. 1, the supercritical drying apparatus 1 includes a controller 100. The controller 100 is, for example, a computer, and is equipped with an operation unit 101 and a storage 102. The storage 102 stores therein a program for controlling various processings performed in the supercritical drying apparatus 1 (or a substrate processing system including the supercritical drying apparatus 1). The operation unit 101 controls operations of the supercritical drying apparatus by reading and executing the program stored in the storage 102. The program may be recorded in a computer-readable recording medium and installed from the recording medium to the storage 102 of the controller 100. The computer-readable recording medium may be, by way of non-limiting example, a hard disk (HD), a flexible disk (FD), a compact disk (CD), a magnet optical disk (MO), a memory card, or the like.

Now, operations of the supercritical drying apparatus 1, particularly, operations from a time point when a substrate W is handed over from the substrate transfer arm (not shown) onto the supporting pins 26 of the substrate holder 20 at the retreat position via the substrate lifter 60 until a time point when the substrate holder 20 is moved from the retreat position to the processing position for a processing of the substrate W will be explained. Further, the substrate W has, for example, a puddle (liquid film) of IPA on a front surface (pattern formation surface) thereof, and a recess of a pattern on the front surface of the substrate W is filled with the IPA. This substrate W has been sequentially subjected to (1) a chemical liquid processing such as wet etching or chemical cleaning, (2) a rinsing processing of washing away a chemical liquid by a rinse liquid, and (3) an IPA replacement processing of replacing the rinse liquid with the IPA to form the puddle (liquid film) of the IPA in, for example, a non-illustrated single-wafer cleaning apparatus. In most cases, a plurality of supercritical drying apparatuses 1 and a plurality of single-wafer cleaning apparatuses are combined to form the single substrate processing (liquid processing and drying) system, and in this substrate processing system, the substrate is transferred by the substrate transfer arm.

The operations to be described below are automatically performed under the control of the controller 100 based on the processing recipes stored in the storage 102 of the controller 100 or sent from a higher-level computer of the controller 100.

<Adjusting Process 1: Horizontal Leveling of Supporting Table 30>

First, the detection light is radiated from each of the first to third distance sensors 51 to 53 to the substrate W placed on the supporting pins 26 of the substrate holder 20 at the retreat position with the front surface (pattern formation surface) thereof facing upwards, and the detection light is radiated from each of the fourth distance sensors 54 to the four corners of the supporting table 30. Based on the detection results of the fourth distance sensors 54, the inclination of the supporting table 30 with respect to the horizontal plane is detected. When the inclination exceeds a tolerance range, the supporting table 30 is leveled by appropriately operating one or more of the four lifting actuators 32. Further, the horizontal leveling (inclination adjustment) of the supporting table 30 is not limited to being performed at this timing immediately before the substrate processing is performed, and may be performed after the substrate processing or in a standby period (for example, when waiting for a next substrate W to be carried in after the current substrate W is carried out from the supercritical drying apparatus 1). The horizontal leveling of the supporting table 30 may be performed at any time during the operation of the supercritical drying apparatus 1, for example, during a supercritical drying processing.

<Adjusting Process 2: Horizontal Leveling of Base Member 22>

Subsequently, the detection light is radiated again from each of the first to fourth distance sensors 51 to 54. Then, based on the detection results of the first distance sensors 51, the inclination of the base member 22 with respect to the horizontal plane is detected. When the inclination exceeds a tolerance range, the base member 22 is leveled by operating the posture adjusting device 28 provided at the substrate holder 20.

<Adjusting Process 3: Horizontal Leveling of Substrate W>

Thereafter, the detection light is radiated from each of the first to fourth distance sensors 51 to 54. Then, based on the detection results of the second distance sensors 52, the inclination of the substrate W on the base member 22 with respect to the horizontal plane is detected. When the inclination exceeds a tolerance range, the substrate W is leveled by operating the supporting pins 26 provided at the base member 22.

<Adjusting Process 4: Height Adjustment of Substrate W>

Next, the detection light is radiated from each of the first to fourth distance sensors 51 to 54. Then, based on the detection results of the third distance sensors 53, the height of the surface of the IPA puddle on the front surface of the substrate W on the base member 22 is detected. When the height exceeds a tolerance range, the height of the substrate W is lowered to an appropriate height by operating the supporting pins 26 provided at the base member 22.

<Adjusting Process 5: Final Check>

Then, the detection light is radiated from each of the first to fourth distance sensors 51 to 54. When none of the inclination of the supporting table 30 with respect to the horizontal plane, the inclination of the base member 22 with respect to the horizontal plane, the inclination of the substrate W with respect to the horizontal plane, and the height of the surface of the IPA puddle on the front surface of the substrate W is problematic, the substrate holder 20 may be moved to the processing position, and the supercritical drying processing may be begun.

The supercritical drying processing can be performed by a commonly known method described in the prior application of the present applicant (for example, Japanese Patent Laid-Open Publication No. 2020-170873, and others). By way of example, by supplying a processing fluid (for example, carbon dioxide) in a supercritical state into the processing space 12 from a source of the processing fluid (not shown), an internal pressure of the processing space 12 is increased to a predetermined pressure (pressure-raising process), and, then, by flowing the supercritical fluid into the processing space 12, the IPA on the substrate W is replaced with the processing fluid (flowing process). When the replacement is completed, the processing fluid is drained from the inside of the processing space 12, and the processing space 12 is decompressed to a normal pressure. Accordingly, the processing fluid in the supercritical state is vaporized, and the substrate W can be dried while suppressing the pattern collapse. At this time, if the front surface of the substrate W is inclined, in-plane uniformity of the thickness of the IPA film may be degraded, causing the deterioration of the in-plane uniformity in the replacement of the supercritical fluid, which in turn may result in the pattern collapse or the deterioration of the particle level. According to the present exemplary embodiment, however, the front surface of the substrate W can be stably maintained horizontal, so that the required processing result can be obtained.

It is desirable to perform all of (1) the adjustment of the inclination of the supporting table 30 with respect to the horizontal plane (horizontal leveling of the supporting table 30), (2) the adjustment of the inclination of the base member 22 with respect to the horizontal plane (horizontal leveling of the base member 22), (3) the adjustment of the inclination of the substrate W with respect to the horizontal plane (horizontal leveling of the substrate W), and (4) the adjustment of the height of the surface of the IPA puddle on the front surface of the substrate W (height adjustment of the substrate) before the processing of each substrate W. However, it takes some time to accomplish all these adjustments. If excessively long time is spent on the adjustments, the IPA puddle may be dried, so that the film thickness of the puddle may be reduced, or the puddle may be partially lost. As a result, there arises a risk that the front surface of the substrate W may be exposed. In this case, the pattern collapse or the deterioration of the particle level may occur.

In order to suppress the aforementioned problems from occurring, the adjustments of (1) to (4) may be stopped in the middle if a predetermined time elapses after the substrate W is carried into the substrate holder 20, and the substrate holder 20 may be moved to the processing position to start the supercritical drying processing. In this case, the remaining adjustments may be performed when the next substrate W is carried into the substrate holder 20. That is, if the predetermined time has passed by at a time point when the adjustments of (1) and (2) for a first substrate W are finished, the adjusting operation is terminated at that time point, and the adjustments of (3) and (4) may be performed on a second substrate W.

Figure 5:
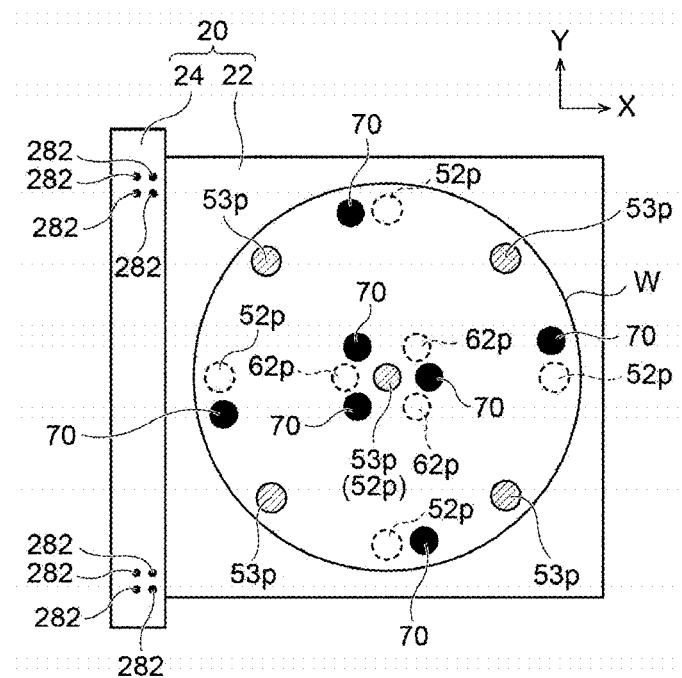
FIG. 5 is a plan view for describing arrangement of attraction pads in a first modification example of the exemplary embodiment, seen from above the substrate holder.

As a first modification of the exemplary embodiment, attraction pads 70 may be provided on the top surface of the base member 22 to be located at positions shown in FIG. 5. The positions where the attraction pads 70 are arranged can be set to be near the radiation positions of the second distance sensors 52 onto the bottom surface of the substrate W when viewed from the top. In addition, since the through hole (position 52p in FIG. 3) for passing the detection light from the second distance sensor 52 is provided at the center of the base member 22, the three attraction pads 70 are disposed to surround this through hole. In the configuration where the attraction pads 70 are provided, the horizontal leveling and the height adjustment of the substrate may be performed in the following sequence. That is, the supporting pins 26 are first raised based on the detection results of the second distance sensors 52 to perform the horizontal leveling of the substrate W. At this time, if a displacement of the substrate W according to a raising amount of the supporting pin 26 is not detected by the second distance sensors 52, it is determined that the substrate W is bent. Then, by attracting the substrate W using the attraction pad 70 closest to the supporting pin 26 for which the displacement of the substrate W according to the raising amount of this supporting pin 26 is not determined, the substrate W needs to be brought into firm contact with the supporting pin 26. Thus, the height adjustment of the substrate W by this supporting pin 26 is enabled.

By way of example, each attraction pad 70 may be configured to be movable up and down with respect to the base member 22 in an up-down direction. With this configuration, it is possible to perform correction of the bending of the substrate W in addition to the horizontal leveling and the height adjustment of the substrate W. In this case, the attraction pads 70 may be provided to the base member 22 with, for example, a linear actuator (not shown) therebetween. In this case, the aforementioned third and fourth processes (3) and (4) can be performed by adjusting the height of each attraction pad 70.

When the substrate W is always attracted by the attraction pads 70 irrespective of the bending of the substrate W, the supporting pins 26 may not be provided. When determining whether or not to use the attraction pads 70 based on the bending of the substrate W, the height of the supporting pin 26 may be lowered when using the attraction pads 70, for example.

As second and third modification examples of the exemplary embodiment, a device (lid inclination detecting device) configured to detect the inclination of the base member 22 with respect to the horizontal plane indirectly by detecting an inclination of the lid 24 formed as one body with the base member 22 may be provided.

Figure 6:
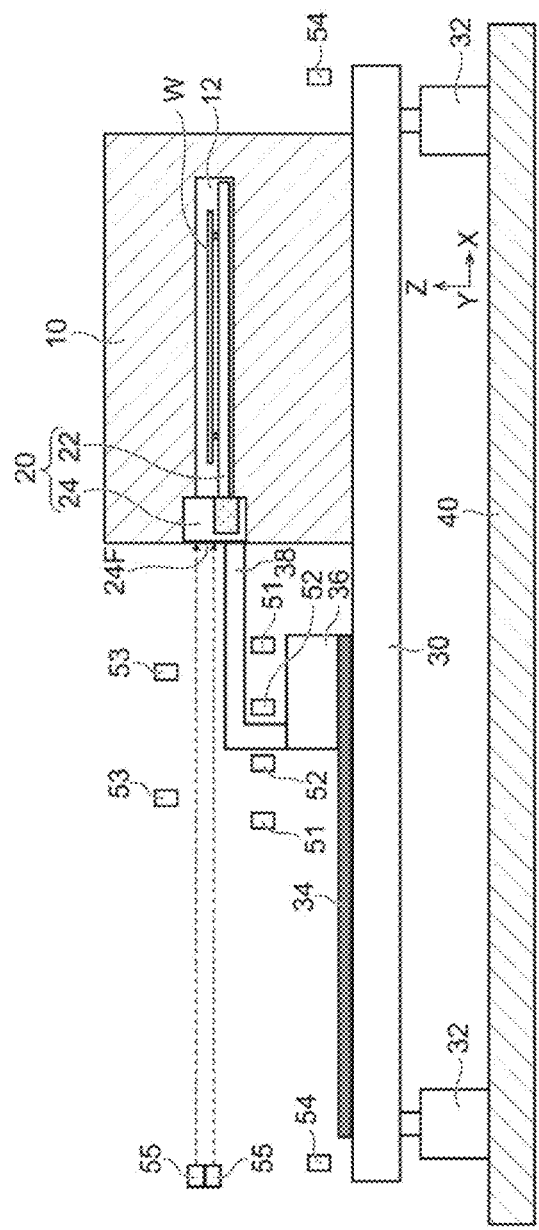
FIG. 6 is a longitudinal side view of the substrate processing apparatus equipped with a distance sensor configured to detect an inclination of a lid according to a second modification example of the exemplary embodiment.
Figure 7:
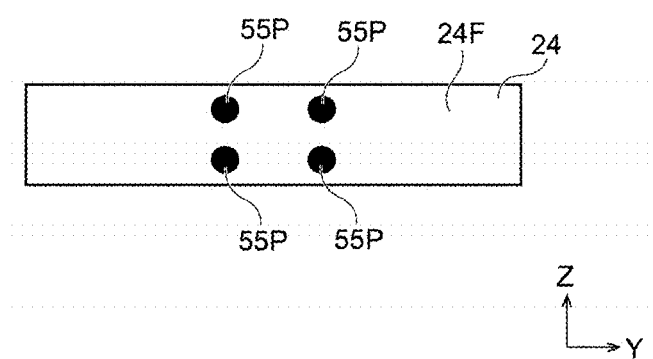
FIG. 7 is a front view of the lid shown in FIG. 6 for describing a radiation position of detection light for the lid.

A configuration of the second modification example is depicted in FIG. 6 and FIG. 7. In the second modification example, a plurality of fifth distance sensors 55 are provided as the lid inclination detecting device. Like the first to fourth distance sensors 51 to 54, the fifth distance sensors 55 may be configured by an optical distance sensor using infrared rays or laser, and are fixed to the machine frame 40 itself or the non-illustrated sensor holder fixed to the machine frame 40. As shown in FIG. 6, when the substrate holder 20 is located at the processing position, the fifth distance sensors 55 radiate sensor light to a plurality of (desirably, three or more: four in the shown example) radiation positions 55P set on a front surface 24F (which is a vertical surface) of the lid 24. Based on a distance between each distance sensor 55 and the radiation position 55P, the coordinates of each radiation position 55P can be specified, and the inclination of the lid 24 can be detected based on the specified coordinates. By setting the three or more radiation positions 55P, the inclination of the lid 24 in any direction can be detected.

Figure 8:
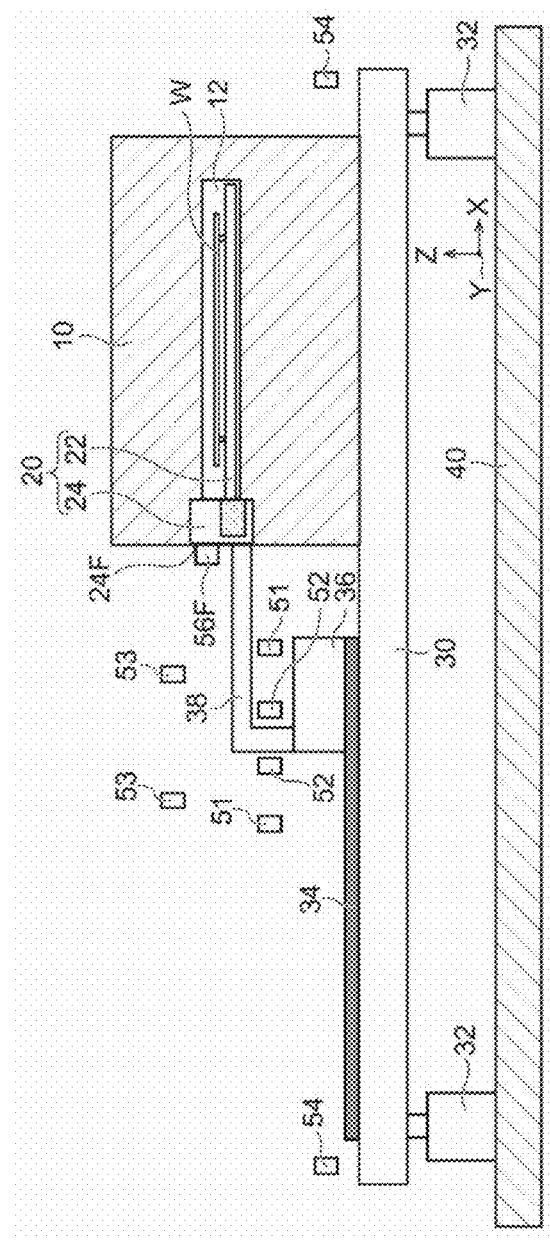
FIG. 8 is a longitudinal side view of the substrate processing apparatus equipped with an inclination sensor configured to detect an inclination of a lid according to a third modification example of the exemplary embodiment.
Figure 9:
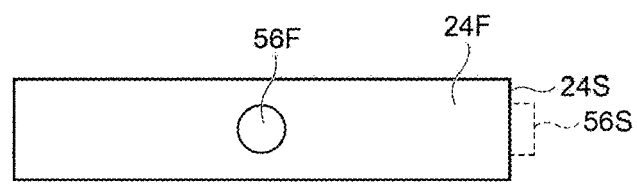
FIG. 9 is a front view of the lid shown in FIG. 8 for describing arrangement of the inclination sensor for the lid.

A configuration of the third modification example is illustrated in FIG. 8 and FIG. 9. In the third modification example, one or more inclination sensors 56 as the lid inclination detecting device are provided. When the inclination sensor 56 is a multi-axis sensor (capable of detecting angular positions around two or more axes extending in different directions), only one inclination sensor 56 may be provided. In this case, this single inclination sensor 56 (56F) may be provided on the front surface 24F of the lid 24, for example. When the inclination sensor 56 is a uniaxial sensor (capable of detecting an angular position around the only one axis), on the other hand, multiple inclination sensors 56 may be provided on two different surfaces (for example, the front surface 24F and a side surface 24S (which is perpendicular to the front surface 24F) facing in different directions. In addition, when the inclination sensor 56 (56S) is provided on the side surface 24S, it is desirable that the lid 24 protrudes forward from a front surface of the processing vessel 10 when the substrate holder 20 is placed at the processing position so that the side surface 24S of the lid 24 is not covered by the processing vessel 10.

According to the second and third modification examples, the inclination of the base member 22 can be detected based on the inclination of the lid 24 during the drying processing of the substrate W or immediately before the beginning of the drying processing when the substrate holder 20 is placed at the processing position. Accordingly, if the base member 22 (that is, the substrate W thereon) is tilted due to, for example, inappropriate interference between the substrate holder 20 and the processing vessel 10, such an event can be detected. When an abnormal inclination of the base member 22 is detected, the controller 100 may set off an alarm to inform an operator of the abnormality, or stop the operation of the supercritical drying apparatus 1.

It should be noted that the above-described exemplary embodiment is illustrative in all aspects and is not anyway limiting. The above-described exemplary embodiment may be omitted, replaced and modified in various ways without departing from the scope and the spirit of claims.

The substrate W is, for example, a semiconductor wafer, but is not limited thereto and may be any of various kinds of substrates (a ceramic substrate, a glass substrate, etc.) for use in the field of semiconductor device manufacture.

According to the exemplary embodiment, it is possible to suppress particle generation on the surface of the substrate in drying the substrate with the processing fluid in the supercritical state.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting. The scope of the inventive concept is defined by the following claims and their equivalents rather than by the detailed description of the exemplary embodiments. It shall be understood that all modifications and embodiments conceived from the meaning and scope of the claims and their equivalents are included in the scope of the inventive concept.

We claim:

1. A substrate processing apparatus configured to dry a substrate having a liquid film formed on a pattern formation surface thereof with a supercritical fluid, the substrate processing apparatus comprising:
    a processing vessel which is configured to accommodate the substrate therein and into which the supercritical fluid is supplied;
    a substrate holder which has a base member configured to support the substrate from below while allowing the pattern formation surface of the substrate to face upwards, and which is configured to hold the substrate within the processing vessel;
    a first detector configured to detect an inclination of the base member with respect to a horizontal plane,
    a posture adjusting device configured to adjust the inclination of the base member with respect to the horizontal plane,
    a controller configured to control the posture adjusting device to perform horizontal leveling of the base member based on a detection result of the first detector, and
    a second detector configured to detect a height position of a surface of the liquid film formed on a top surface of the substrate supported by the base member,
    wherein the base member includes a base member main body, multiple supporting members protruding upwards from the base member main body to support the substrate from below, and a lifting device configured to move the multiple supporting members up and down with respect to the base member main body, and
    the controller performs the horizontal leveling of the base member by the posture adjusting device based on the detection result of the first detector, and then performs height adjustment of the height position of the surface of the liquid film by the lifting device based on a detection result of the second detector.

2. The substrate processing apparatus of claim 1, wherein the processing vessel has an opening through which the substrate is accommodated,
    the substrate holder includes a lid connected to the base member and configured to close the opening,
    the substrate holder is configured to be moved back and forth between a processing position and a retreat position,
    the lid closes the opening and the base member is accommodated in the processing vessel when the substrate holder is located at the processing position,
    the lid opens the opening and the base member is retreated to an outside of the processing vessel when the substrate holder is located at the retreat position, and
    the first detector is provided at a position where the first detector is allowed to detect the inclination of the base member with respect to the horizontal plane when the substrate holder is located at the retreat position.

3. The substrate processing apparatus of claim 2, wherein the first detector is provided under the base member of the substrate holder which is located at the retreat position.

4. The substrate processing apparatus of claim 2, wherein the first detector includes three or more optical sensors allowed to measure three or more height positions of a bottom surface of the base member.

5. The substrate processing apparatus of claim 2, wherein the second detector is provided above the base member of the substrate holder located at the retreat position.

6. The substrate processing apparatus of claim 2, further comprising:
    a third detector configured to detect an inclination of the substrate supported by the base member with respect to the horizontal plane.

7. The substrate processing apparatus of claim 6, wherein the third detector is provided under the base member of the substrate holder which is located at the retreat position.

8. The substrate processing apparatus of claim 6, wherein the third detector includes three or more optical sensors allowed to detect three or more height positions of a bottom surface of the substrate, and
    the base member is provided with notches allowing light radiated from the optical sensors to be radiated to the bottom surface of the substrate.

9. The substrate processing apparatus of claim 6, wherein the controller performs horizontal leveling of the substrate by the lifting device based on a detection result of the third detector after performing the horizontal leveling of the base member by the posture adjusting device based on the detection result of the first detector and concurrently with, before or after performing the height adjustment of the height position of the surface of the liquid film by the lifting device based on the detection result of the second detector.

* * * * *